United States Patent
Kim

(10) Patent No.: US 8,121,244 B2
(45) Date of Patent: Feb. 21, 2012

(54) DUAL SHIFT REGISTER

(75) Inventor: Hong Jae Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/829,196

(22) Filed: Jul. 1, 2010

(65) Prior Publication Data

US 2011/0002438 A1    Jan. 6, 2011

(30) Foreign Application Priority Data

Jul. 3, 2009  (KR) .................. 10-2009-0060786

(51) Int. Cl.
*G11C 19/00* (2006.01)

(52) U.S. Cl. ................. 377/64; 377/69; 377/78; 377/79

(58) Field of Classification Search .................... None
See application file for complete search history.

(56) References Cited

U.S. PATENT DOCUMENTS

| | | | |
|---|---|---|---|
| 6,970,274 B2 * | 11/2005 | Morita et al. ................. | 358/474 |
| 7,436,923 B2 * | 10/2008 | Tobita ........................... | 377/64 |
| 7,738,623 B2 * | 6/2010 | Tobita ........................... | 377/64 |
| 7,831,010 B2 * | 11/2010 | Tobita ........................... | 377/64 |
| 7,873,140 B2 * | 1/2011 | Moon et al. .................... | 377/76 |
| 7,929,658 B2 * | 4/2011 | Lin et al. ........................ | 377/64 |
| 2006/0001637 A1 * | 1/2006 | Pak et al. ...................... | 345/100 |
| 2007/0046844 A1 * | 3/2007 | Murade .......................... | 349/5 |
| 2007/0195053 A1 * | 8/2007 | Tobita et al. .................. | 345/100 |
| 2009/0167668 A1 * | 7/2009 | Kim ............................... | 345/100 |
| 2010/0231497 A1 * | 9/2010 | Liao et al. ..................... | 345/100 |

* cited by examiner

*Primary Examiner* — Tuan T Lam
(74) *Attorney, Agent, or Firm* — McKenna Long & Aldridge, LLP

(57) ABSTRACT

Disclosed is a dual shift register that includes a first shift register configured to include a plurality of stages which sequentially output scan pulses using at least two clock signals with sequential and circular phases, and a second shift register configured to a plurality of stages which form pair with the respective stages of the first shift register and sequentially output the scan pulses using at least two clock signals. Each stage includes: a scan direction controller configured to respond to the scan pulses from previous and next stages and to selectively output forward and reverse direction voltages with opposite electric potentials to each other; and an output portion configured to respond to the output signal of the scan direction controller, to generate two sequential scan pulses using two of the at least two clock signals, and to distribute the sequential scan pulses to the previous and next stages.

3 Claims, 8 Drawing Sheets

DUAL SHIFT REGISTER

CROSS-REFERENCE TO RELATED APPLICATION

This application claims priority under 35 U.S.C. 119 to Korean Patent Application No. 10-2009-0060786, filed on Jul. 3, 2009, which is hereby incorporated by reference in its entirety.

BACKGROUND

1. Field of the Disclosure

This disclosure relates to a dual shift register.

2. Description of the Related Art

In general, the liquid crystal display (LCD) device controls light transmittance of a liquid crystal using an electric field, in order to display images. To this end, the LCD device includes an LCD panel configured to include pixels arranged in a matrix shape and a driver circuit configured to driver the LCD panel.

The LCD panel includes a plurality of gate lines and a plurality of data lines arranged to cross each other and a plurality of pixel regions defined by the crossed gate and data lines. Also, the LCD panel includes pixel electrodes and a common electrode formed to apply the electric field to the respective pixel regions.

Each of the pixel electrodes is connected to the respective data line through source and drain electrode of a respective thin film transistor (hereinafter, TFT). The TFT is turned-on by a scan pulse applied to its gate electrode through the respective gate line so that a data signal on the respective data line is charged in the respective pixel electrode.

On the other hand, the driver circuit for driving the LCD panel includes a gate driver configured to drive the gate lines and a data driver configured to driver the data lines. The driver circuit further includes a timing controller configured to apply control signals for controlling the gate and data drivers and a power supply unit configured to provide a variety of driving voltages which are used for the LCD device.

The gate driver sequentially applies the scan pulses to the gate lines and enables liquid crystal cells on the LCD panel to be sequentially driven by one line. To this end, the gate driver includes a shift register configured to sequentially generate the scan pulses.

The related art gate driver is formed on one edge of the LCD panel, more specifically, one side of non-display area within the LCD panel. Meanwhile, as the LCD device is recently enlarged in size, the gate lines are lengthened. Due to this, it is enlarged a deviation of the gate driving voltage between both ends of the gate line.

The lengthened gate line formed on the LCD panel increases the propagation delay of the gate driving voltage. Therefore, image quality of the LCD device is deteriorated.

Moreover, a gate driver with the shift register can be mounted on the LCD panel. In this case, the gate driver on the LCD panel occupies a relatively large area. As such, it is very difficult to load (or mount) the gate driver on an LCD model within a limited design area

BRIEF SUMMARY

Accordingly, the present embodiments are directed to a shift register that substantially obviates one or more of problems due to the limitations and disadvantages of the related art.

An object of the present embodiment is to provide a dual shift register that is adapted to apply a fixed driving voltage when an LCD device with high definition and enlarged size is driven and to reduce an occupying area of a gate driver.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a dual shift register includes: a first shift register configured to include a plurality of stages which sequentially output scan pulses using at least two clock signals with sequential and circular phases; and a second shift register configured to a plurality of stages which form pair with the respective stages of the first shift register and sequentially output the scan pulses using at least two clock signals. Each of the stages includes: a scan direction controller configured to respond to the scan pulses from previous and next stages and to selectively output forward and reverse direction voltages with opposite electric potentials to each other; and an output portion configured to respond to the output signal of the scan direction controller, to generate two sequential scan pulses using two of the at least two clock signals, and to distribute the sequential scan pulses to the previous and next stages.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
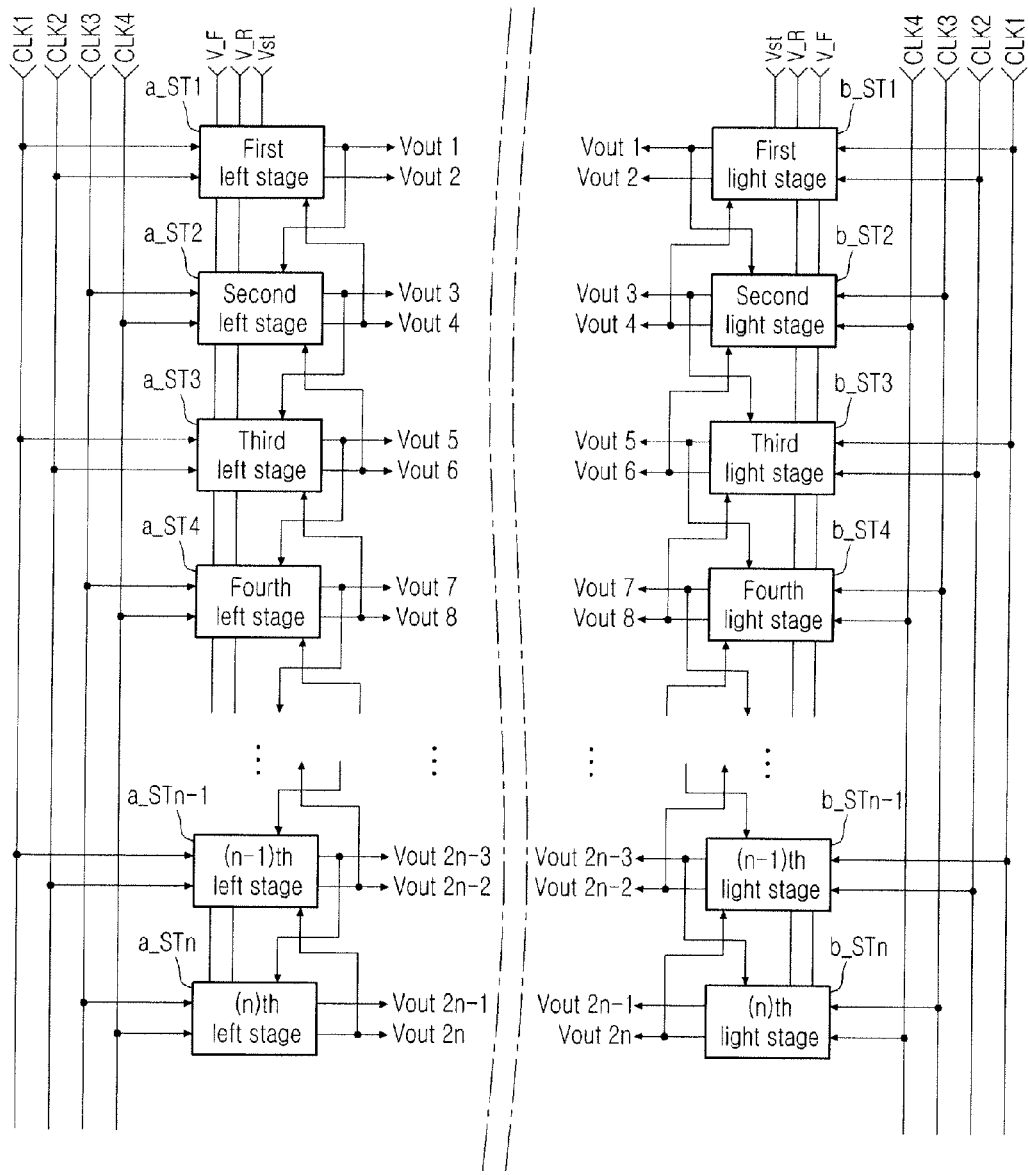
FIG. 1 is a block diagram showing a dual shift register according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 2:
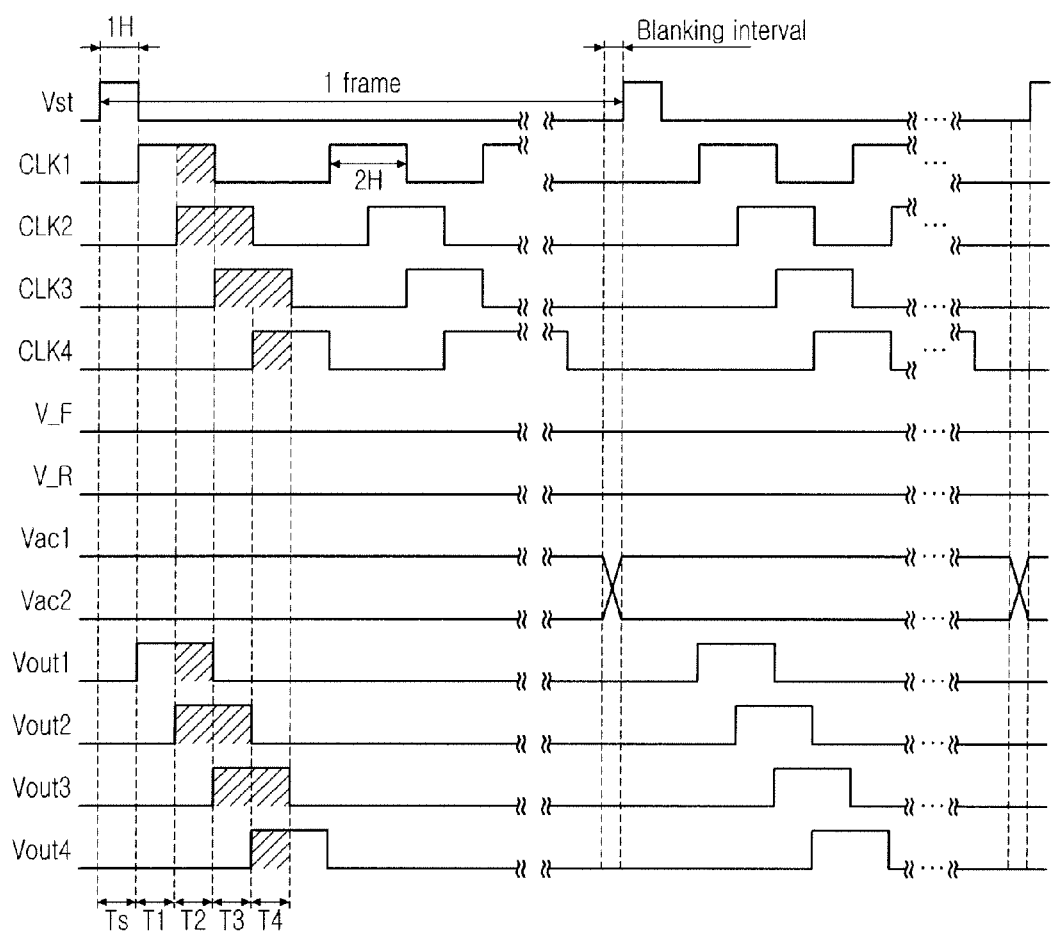
FIG. 2 is a timing chart illustrating a variety of signals applied to the dual shift register of FIG. 1.

FIG. 1 is a block diagram showing a dual shift register according to an embodiment of the present disclosure. FIG. 2 is a timing chart illustrating a variety of signals applied to the dual shift register of FIG. 1.

The dual shift register according to an embodiment of the present disclosure includes stages a_ST1~a_STn and b_ST1~b_STn arranged by "n" on left and right sides in the center of a display area (not shown) of the LCD panel. Each of the left and right stages a_ST1~a_STn and b_ST1~b_STn outputs two times the scan pulse during one frame period.

Each of the left and right stages a_ST1~a_STn and b_ST1~b_STn drives the gate lines connected to it and controls the operations of previous and next stages adjacent to it, using the scan pulses. To this end, each of the left and right stages a_ST1~a_STn and b_ST1~b_STn is connected to two gate lines, and each pair of the left and right stages opposite to each other are commonly connected to the same two gate lines. For example, a first left stage a_ST1 is connected to the left ends of first and second gate lines, and a first right stage b_ST1 is connected to the right ends of first and second gate lines.

Furthermore, the left and right stages a_ST1~a_STn and b_ST1~b_STn can be driven in either a forward direction or a reverse direction according to statuses of forward and reverse direction voltage V_F and V_R.

The forward direction driving mode will now be mainly explained. However, the reverse direction driving mode can be driven in the same manner as the forward direction driving.

In the forward direction driving mode, the left and right stages a_ST1~a_STn and b_ST1~b_STn output the scan pulses in sequence of from top-left and top-right stages a_ST1 and b_ST1 to bottom-left and bottom-right stages a_STn and b_STn. More specifically, the first left and right stages a_ST1 and b_ST1 simultaneously output first and second scan pulses which are sequentially generated, and then the second left and right stages a_ST2 and b_ST2 simultaneously output third and fourth sequential scan pulses. Subsequently, the third left and right stages a_ST3 and b_ST3 simultaneously output fifth and sixth sequential scan pulses. In this way, the nth left and right stages a_STn and b_STn simultaneously output (2n−1)th and 2nth sequential scan pulses.

On the contrary, when the dual shift register are driven in the reverse direction, the left and right stages a_ST1~a_STn and b_ST1~b_STn output the scan pulses in a sequence from bottom-left and bottom-right stages a_STn and b_STn to top-left and top-right stages a_ST1 and b_ST1. In other words, the reverse direction driving mode allows the left and right stages a_ST1~a_STn and b_ST1~b_STn to sequentially output a pair of sequential scan pulses in the sequence from the nth left and right stages a_STn and b_STn to the first left and right stages a_ST1 and b_ST1.

In this manner, the sequential scan pulses output from the left and right stages a_ST1~a_STn and b_ST1~b_STn are applied to gate lines formed on an LCD panel (not shown). Therefore, the gate lines can be sequentially scanned.

The dual shift register of the present embodiment can be mounted (or loaded) on the LCD panel. In this case, as the LCD panel is defined into a display area and a non-display area surrounding the display area, the dual shift register is distributively disposed on both sides of the non-display area in the center of the display area.

The left and right stages a_ST1~a_STn and b_ST1~b_STn included in such a dual shift register each receive two clock pulses with different phases among first through fourth clock pulses CLK1 through CLK4 which are circulated in such a manner as to be sequentially shifted by a fixed phase difference from one another, as shown in FIG. 2. Also, the left and right stages a_ST1~a_STn and b_ST1~b_STn each input a discharging voltage Vss, first and second AC (Alternate Current) voltages Vac1 and Vac2, a forward direction voltage V_F, and a reverse direction voltage V_R.

The discharging voltage Vss is a DC (Direct Current) voltage. Also, the discharging voltage Vss has a negative polarity voltage. Alternatively, the discharging voltage Vss can have a ground voltage.

The first and second AC voltages Vac1 and Vac2 are used to control charging and discharging of a reset node which is included in several nodes within each of the left and right stages a_ST1~a_STn and b_ST1~b_STn. The first and second AC voltages Vac1 and Vac2 all are an AC voltage with a fixed frequency. The first AC voltage Vac1 has a phase-inverted waveform (i.e., a waveform shifted by 180°) in comparison with the second AC voltage Vac2. High status levels of the first and second AC voltages Vac1 and Vac2 can be equal to the high status voltage levels of the clock pulses CLK1~CLK4, and low status level of the first and second AC voltages Vac1 and Vac2 can be the same as that of the discharging voltage Vss. The statuses of the first and second AC voltages Vac1 and Vac2 are inverted to each other every a period of p frames. The character "p" is a natural number.

The first through fourth clock pulses CLK1 through CLK4 are used for the generation of the scan pulses in the left and right stages a_ST1~a_STn and b_ST1~b_STn. Each of the left and right stages a_ST1~a_STn and b_ST1~b_STn receives either two or all among the first through fourth clock pulses CLK1 through CLK4, in order to generate the two sequential scan pulses. More specifically, an X-type stage of FIG. 3 and a Y-type stage of FIG. 4 included in the dual shift register of FIG. 1 each respond to two among the first through fourth clock pulses CLK1 through CLK4 and each generate the two sequential scan pulses. For example, an odd-numbered stage generates the two sequential scan pulses using the first and second clock pulses CLK1 and CLK2, and an even-numbered stage generates the two sequential scan pulses using the third and fourth clock pulses CLK3 and CLK4. On the other hand, a Z-type stage of FIG. 5 uses two of the first through fourth clock pulses CLK1 through CLK4 for the generation of the two sequential scan pulses, and employs the rest of the first through fourth clock pulses CLK1 through CLK4 for its control.

Although the dual shift register of the present embodiment is described to use four clock pulses with different phases, it is not limited to the number of clock pulses even though the clock pulses with the different phases are at least two clock pulses.

Also, the first through fourth clock pulses CLK1 through CLK4 are generated to have different phases sequentially shifted by a fixed phase difference from one another. In detailed, the second clock pulse CLK2 is provided with a phase delayed by the fixed phase difference from the first clock pulse CLK1. The third clock pulse CLK3 is output to have another phase delayed by the fixed phase difference from the second clock pulse CLK2. The fourth clock pulse CLK4 is generated to have still another phase delayed by the fixed phase difference from the third clock pulse CLK3. The first clock pulse CLK1 is applied to have further still another phase delayed by a fixed phase difference from the fourth clock pulse CLK4.

In accordance therewith, the first through fourth clock pulses CLK1 through CLK4 are output in a sequential and circular manner. In other words, the first through fourth clock pulses CLK1 through CLK4 can be sequentially output again, after the sequential output of the first to fourth clock pulses CLK1 to CLK4 is completed. As such, the first clock pulse CLK1 is output during the period between the fourth and second clock pulses CLK4 and CLK2.

A start pulse Vst is output one time during one frame period, even though the first through fourth clock pulses CLK1 through CLK4 are output several times during one frame period. More specifically, although the first through fourth clock pulses CLK1 through CLK4 are periodically activated several times in a high logic state during one frame period, the start pulse Vst is enabled only one time in the high logic state during one frame period. As such, the start pulse Vst is output prior to any one of the first through fourth clock pulses CLK1 through CLK4 during one frame period.

If the dual shift register is in the forward direction driving mode, the first through fourth clock pulses CLK1 through CLK4 are provided in the forward sequence from the first clock pulse CLK1 to the fourth clock pulse CLK4. On the contrary, when the dual shift register is in the reverse direction driving mode, the first through fourth clock pulses CLK1 through CLK4 are applied in the reverse sequence from the fourth clock pulse CLK4 to the first clock pulse CLK1.

The dual shift register of the present embodiment can enable the first through fourth clock pulses CLK1 through CLK4 to partially overlap with one another in pulse width. In other words, the first half-width of a (i)th clock pulse overlaps with the second half-width of a (i−1)th clock pulse, and the second half-width of the (i)th clock pulse overlaps with the first half-width of a (i+1)th clock pulse, as diagonally lined portions in FIG. 2. The character "i" is a natural number of at least 2.

For example, as shown in FIG. 2, if the first through fourth clock pulses each have a pulse width corresponding to two horizontal synchronous signal period 2H, the adjacent clock pulses overlap with each other by one horizontal synchronous signal period 1H. However, the overlapped width between the adjacent clock pulses is not limited to the half pulse width of the clock pulse. In other words, the overlapped width between the clock pulses can be changed, if necessary.

When the first and fourth clock pulses CLK1 through CLK4 are applied to overlap with one another, the scan pulses output from the left and right stages a_ST1~a_STn and b_ST1~b_STn partially overlap with one another in width, as shown in FIG. 2.

The left and right stages a_ST1~a_STn and b_ST1~b_STn shown in FIG. 1 are driven by the variety of signals with the characteristics described above.

In order to output the scan pulses, each of the left and right stages a_ST1~a_STn and b_ST1~b_STn must be first enabled. The enabled stage ST means the state that the stage makes it possible to output the scan pulse. In other words, the enabling stage ST can output a clock pulse as a scan pulse. If the dual shift register is driven in the forward direction, each of the left and right stages a_ST1~a_STn and b_ST1~b_STn is enabled by the former scan pulse of two sequential scan pulses applied from a previous stage. For example, a jth stage responds to the former scan pulse of two sequential scan pulses from a (j−1)th stage and is enabled.

After the scan pulse is output, each of the left and right stages a_ST1~a_STn and b_ST1~b_STn must be disabled. The disabled stage ST corresponds to the state that the stage makes it absolutely impossible to output the scan pulse. In other words, the disabling stage ST can not output a clock pulse as a scan pulse. When the dual shift register is driven in the forward direction, each of the left and right stages a_ST1~a_STn and b_ST1~b_STn is disabled by the latter scan pulse of two sequential scan pulses applied from a next stage. For example, a jth stage responds to the latter scan pulse of two sequential scan pulses from a (j+1)th stage and is disabled.

Figure 3:
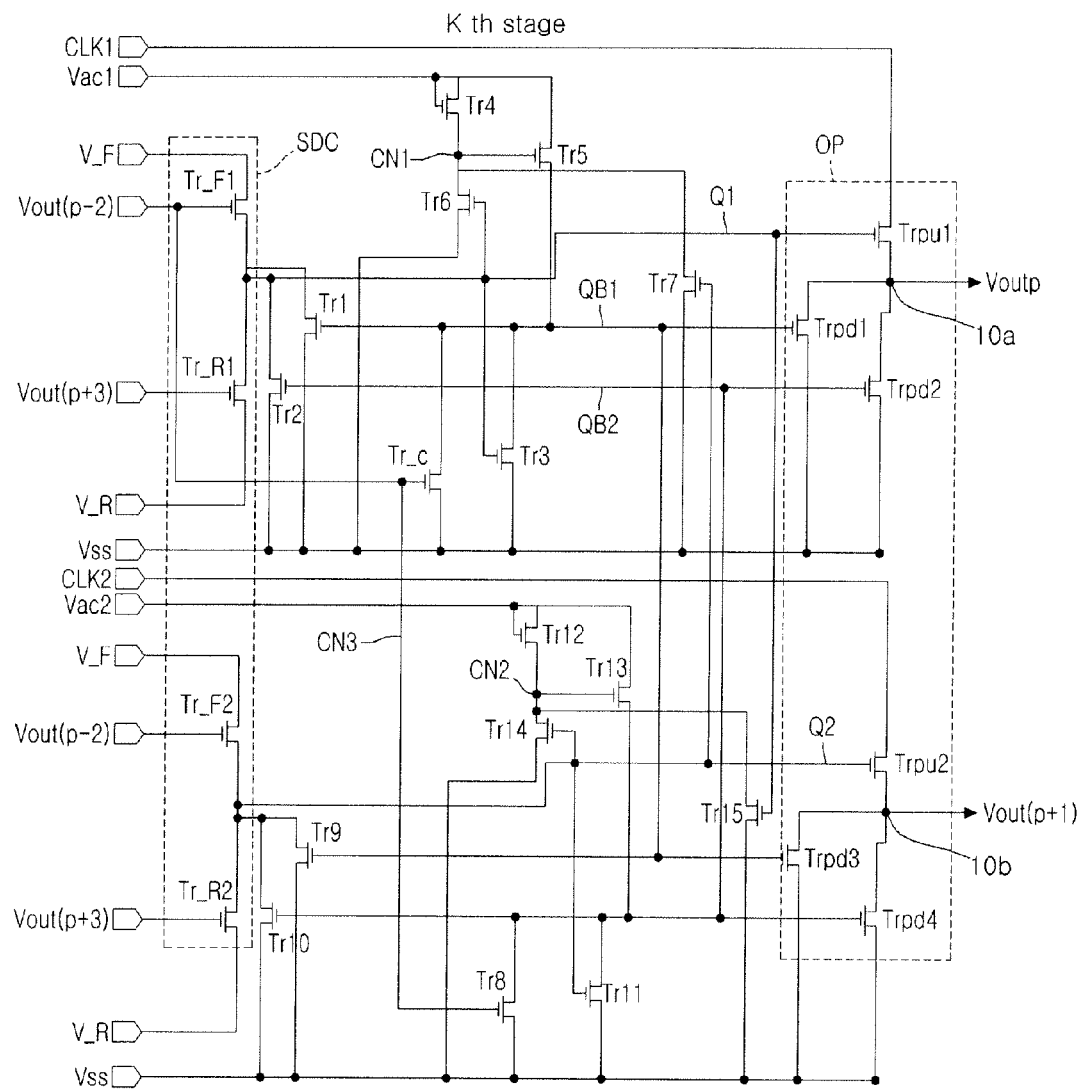
FIG. 3 is a circuit diagram showing the configuration of an X-type stage among stages included in the dual shift register of FIG. 1.

FIG. 3 is a circuit diagram showing the configuration of an X-type stage among stages included in the dual shift register of FIG. 1.

The left stages a_ST1~a_STn and the right stages b_ST1~b_STn connected to the same gate lines form stage pairs, respectively. Any one of the left and right stages included in each stage pair has the same configuration as the X-type stage shown in FIG. 3. The X-type stage includes a node controller, a scan direction controller SDC, and an output portion OP.

The node controller is configured to control status of signals on first and second set nodes Q1 and Q2 and first and second reset nodes QB1 and QB2. If the X-type stage of FIG. 3 is used for one of kth left and right stages, the node controller may include first through fifth switching elements Tr1 through Tr15. The character "k" is an arbitrary natural number.

The first switching element Tr1 included in the kth stage is turned on/off depending upon the status of a signal on the first reset node QB1. Also, the first switching element Tr1 is connected between the first set node Q1 and a discharging voltage line Vss. Such a first switching element Tr1 included in the kth stage includes a gate terminal connected to the first reset node QB1, a drain terminal connected to the first set node Q1, and a source terminal connected to the discharging voltage line Vss.

The second switching element Tr2 included in the kth stage is turned on/off depending upon the status of a signal on the second reset node QB2. Also, the second switching element Tr2 is connected between the first set node Q1 and the discharging voltage line Vss. Such a second switching element Tr2 included in the kth stage includes a gate terminal connected to the second reset node QB2, a drain terminal connected to the first set node Q1, and a source terminal connected to the discharging voltage line Vss.

The third switching element Tr3 included in the kth stage is turned on/off depending upon the status of the signal on the first set node Q1. Also, the third switching element Tr3 is connected between the first reset node QB1 and the discharging voltage line Vss. Such a third switching element Tr3 included in the kth stage includes a gate terminal connected to the first set node Q1, a drain terminal connected to the first reset node QB1, and a source terminal connected to the discharging voltage line Vss.

The fourth switching element Tr4 included in the kth stage turned on/off depending upon a first AC voltage Vac1 from the first AC voltage line Vac1. Also, the fourth switching element Tr4 is connected between a first AC voltage line Vac1 and a first common node CN1. Such a fourth switching element Tr4 included in the kth stage includes gate and drain terminals, which are connected to the first AC voltage line Vac1, and a source terminal connected to the first common node CN1.

The fifth switching element Tr5 included in the kth stage is turned on/off depending upon the status of a signal on the first common node CN1. Also, the fifth switching element Tr5 is connected between the first AC voltage line Vac1 and the first reset node QB1. Such a fifth switching element Tr5 included in the kth stage includes a gate terminal connected to the first common node CN1, a drain terminal connected to the first AC voltage line Vac1, and a source terminal connected to the first reset node QB1.

The sixth switching element Tr6 included in the kth stage is turned on/off depending upon the status of the signal on the first set node Q1. Also, the sixth switching element Tr6 is connected between the first common node CN1 and the discharging voltage line Vss. Such a sixth switching element Tr6 included in the kth stage includes a gate terminal connected to the first set node Q1, a drain terminal connected to the first common node CN1, and a source terminal connected to the discharging voltage line Vss.

The seventh switching element Tr7 included in the kth stage is turned on/off depending upon the status of the signal on the second set node Q2. Also, the seventh switching element Tr7 is connected between the first common node CN1 and the discharging voltage line Vss. Such a seventh switching element Tr7 included in the kth stage includes a gate terminal connected to the second set node Q2, a drain terminal connected to the first common node CN1, and a source terminal connected to the discharging voltage line Vss.

The twelfth through fifth switching elements can be used to configure a second charging unit. The second charging unit responds to the signal on the second set node Q2 and to charge the second AC voltage Vac2 into the second reset node QB2.

The eighth switching element Tr8 included in the kth stage is turned on/off depending upon the former scan signal Vout(p-2) of two sequential scan signals which is applied from a (k-1)th stage. Also, the eighth switching element Tr8 is connected between the second reset node QB2 and a discharging voltage line Vss. Such an eighth switching element Tr8 included in the kth stage includes a gate terminal connected to a first input terminal Vout(p-2) of the scan direction controller SDC, a drain terminal connected to the second reset node QB2, and a source terminal connected to the discharging voltage line Vss.

The ninth switching element Tr9 included in the kth stage is turned on/off depending upon the status of the signal on the first reset node QB1. Also, the ninth switching element Tr9 is connected between the second set node Q2 and the discharging voltage line Vss. Such a ninth switching element Tr9 included in the kth stage includes a gate terminal connected to the first reset node QB1, a drain terminal connected to the second set node Q2, and a source terminal connected to the discharging voltage line Vss.

The tenth switching element Tr10 included in the kth stage is turned on/off depending upon the status of the signal on the second reset node QB2. Also, the tenth switching element Tr10 is connected between the second set node Q2 and the discharging voltage line Vss. Such a tenth switching element Tr10 included in the kth stage includes a gate terminal connected to the second reset node QB2, a drain terminal connected to the second set node Q2, and a source terminal connected to the discharging voltage line Vss.

The eleventh switching element Tr11 included in the kth stage is turned on/off depending upon the status of the signal on the second set node Q2. Also, the eleventh switching element Tr11 is connected between the second reset node QB2 and the discharging voltage line Vss. Such an eleventh switching element Tr11 included in the kth stage includes a gate connected to the second set node Q2, a drain terminal connected to the second reset node QB2, and a source terminal connected to the discharging voltage line Vss.

The twelfth switching element Tr12 included in the kth stage is turned on/off depending upon a second AC voltage Vac2 from the second AC voltage line Vac2. Also, the twelfth switching element Tr12 is connected between a second AC voltage line Vac2 and a second common node CN2. Such a twelfth switching element Tr12 included in the kth stage includes gate and drain terminals, which are connected to the second AC voltage line Vac2, and a source terminal connected to the second common node CN2.

The thirteenth switching element Tr13 included in the kth stage is turned on/off depending upon the status of a signal on the second common node CN2. Also, the thirteenth switching element Tr13 is connected between the second AC voltage line Vac2 and the second reset node QB2. Such a thirteenth switching element Tr13 included in the kth stage includes a gate terminal connected to the second common node CN2, a drain terminal connected to the second AC voltage line Vac2, and a source terminal connected to the second reset node QB2.

The fourteenth switching element Tr14 included in the kth stage is turned on/off depending upon the status of the signal on the second set node Q2. Also, the fourteenth switching element Tr14 is connected between the second common node CN2 and the discharging voltage line Vss. Such a fourteenth switching element Tr14 included in the kth stage includes a gate terminal connected to the second set node Q2, a drain terminal connected to the second common node CN2, and a source terminal connected to the discharging voltage line Vss.

The fifteenth switching element Tr15 included in the kth stage is turned on/off depending upon the status of the signal on the first set node Q1. Also, the fifteenth switching element Tr15 is connected between the second common node CN2 and the discharging voltage line Vss. Such a fifteenth switching element Tr15 included in the kth stage includes a gate terminal connected to the first set node Q1, a drain terminal connected to the second common node CN2, and a source terminal connected to the discharging voltage line Vss.

The twelfth through fifth switching elements can be used to configure a second charging unit. The second charging unit responds to the signal on the second set node Q2 and to charge the second AC voltage Vac2 into the second reset node QB2.

The scan direction controller SDC includes first and second forward direction switching elements Tr_F1 and Tr_F2 and first and second reverse direction switching elements Tr_R1 and Tr_F2. Also, the scan direction controller SDC can include a control switching element Tr_C.

The first forward direction switching element Tr_F1 included in the kth stage is turned on/off depending upon the former scan pulse Vout(p-2) of two sequential scan pulses which are output from the (k-1)th stage. Also, the first forward direction switching element Tr_F1 is connected between a forward direction voltage line V_F and the first set node Q1. Such a first forward direction switching element Tr_F1 within the kth stage includes a gate terminal connected to a first output terminal 10a of the (k-1)th stage, a drain terminal connected to the forward direction voltage line V_F, and a source terminal connected to the first set node Q1.

The first reverse direction switching element Tr_R1 included in the kth stage is turned on/off depending upon the latter scan pulse Vout(p+3) of two sequential scan pulses which are output from the (k+1)th stage. Also, the first reverse direction switching element Tr_R1 is connected between the first set node Q1 and a reverse direction voltage line V_R. Such a first reverse direction switching element Tr_R1 within the kth stage includes a gate terminal connected to a second output terminal 10b of the (k+1)th stage, a drain terminal connected to the first set node Q1, and a source terminal connected to the reverse direction voltage line V_R.

The second forward direction switching element Tr_F2 included in the kth stage is turned on/off depending upon the former scan pulse Vout(p−2) of two sequential scan pulses which are output from the (k−1)th stage. Also, the second forward direction switching element Tr_F2 is connected between the forward direction voltage line V_F and the second set node Q2. Such a second forward direction switching element Tr_F2 within the kth stage includes a gate terminal connected to the first output terminal 10a of the (k−1)th stage, a drain terminal connected to the forward direction voltage line V_F, and a source terminal connected to the second set node Q2.

The second reverse direction switching element Tr_R2 included in the kth stage is turned on/off depending upon the latter scan pulse Vout(p+3) of two sequential scan pulses which are output from the (k+1)th stage. Also, the second reverse direction switching element Tr_R2 is connected between the second set node Q2 and the reverse direction voltage line V_R. Such a second reverse direction switching element Tr_R2 within the kth stage includes a gate terminal connected to a second output terminal 10b of the (k+1)th stage, a drain terminal connected to the second set node Q2, and a source terminal connected to the reverse direction voltage line V_R.

The control switching element Tr_C included in the kth stage is turned on/off depending upon the status of a signal on a third common node CN3. Also, the control switching element Tr_C is connected between the first reset node QB1 and the discharging voltage line Vss. Such a control switching element Tr_C within the kth stage includes a gate terminal connected to the third common node CN3, a drain terminal connected to the first reset node QB1, and a source terminal connected to the discharging voltage line Vss. The third common node CN3 is connected to the first output terminal 10a of the (k−1)th stage. As such, the third common node CN3 receives the former scan pulse Vout(p−2) of two sequential scan pulses which are output from the (k−1)th stage. Consequently, the control switching element Tr_C is turned on/off depending upon the former scan pulse Vout(p−2) from the (k−1)th stage, because its gate terminal is connected to the first output terminal of the (k−1) stage.

The output portion OP includes first and second pull-up switching elements Trpu1 and Trpu2, and first through fourth pull-down switching elements Trpd1 through Trpd4.

The first pull-up switching element Trpu1 is turned on/off depending upon the status of the signal on the first set node Q1. Also, the first pull-up switching element Trpu1 is connected between one of the clock transmission lines CLK1 through CLK4, which are used for transferring the clock pulses CLK1 through CLK4, and a first output terminal 10a. Such a first pull-up switching element Trpu1 includes a gate terminal connected to the first set node Q1, a drain terminal connected to one of the clock transmission lines CLK1 through CLK4, and a source terminal connected to the first output terminal 10a.

The second pull-up switching element Trpu2 is turned on/off depending upon the status of the signal on the second set node Q2. Also, the second pull-up switching element Trpu2 is connected between another one of the clock transmission lines CLK1 through CLK4, which are used for transferring the clock pulses CLK1 through CLK4, and a second output terminal 10b. Such a second pull-up switching element Trpu2 includes a gate terminal connected to the second set node Q2, a drain terminal connected to another one of the clock transmission lines CLK1 through CLK4, and a source terminal connected to the second output terminal 10b. The drain terminals of the first and second pull-up switching elements Trpu1 and Trpu2 are connected to two different clock transmission lines (for example, the first and second clock transmission lines CLK1 and CLK2), respectively.

The first pull-down switching element Trpd1 is turned on/off depending upon the status of the signal on the first reset node QB1. Also, the first pull-down switching element Trpd1 is connected between the first output terminal 10a and the discharging voltage line Vss. Such a first pull-down switching element Trpd1 includes a gate terminal connected to the first reset node QB1, a drain terminal connected to the first output terminal 10a, and a source terminal connected to the discharging voltage line Vss.

The second pull-down switching element Trpd2 is turned on/off depending upon the status of the signal on the second reset node QB2. Also, the second pull-down switching element Trpd2 is connected between the first output terminal 10a and the discharging voltage line Vss. Such a second pull-down switching element Trpd2 includes a gate terminal connected to the second reset node QB2, a drain terminal connected to the first output terminal 10a, and a source terminal connected to the discharging voltage line Vss.

The third pull-down switching element Trpd3 is turned on/off depending upon the status of the signal on the first reset node QB1. Also, the third pull-down switching element Trpd3 is connected between the second output terminal 10b and the discharging voltage line Vss. Such a third pull-down switching element Trpd3 includes a gate terminal connected to the first reset node QB1, a drain terminal connected to the second output terminal 10b, and a source terminal connected to the discharging voltage line Vss.

The fourth pull-down switching element Trpd4 is turned on/off depending upon the status of the signal on the second reset node QB2. Also, the fourth pull-down switching element Trpd4 is connected between the second output terminal 10b and the discharging voltage line Vss. Such a fourth pull-down switching element Trpd4 includes a gate terminal connected to the second reset node QB2, a drain terminal connected to the second output terminal 10b, and a source terminal connected to the discharging voltage line Vss.

The operation of the X-type stage included in the dual shift register of the present embodiment will now be described. Also, the operation of the dual shift register in accordance with the forward direction driving mode will be explained referring to FIGS. 1 through 3.

In the forward direction driving mode, the clock pulses CLK1 through CLK4 are applied in a sequence from the first clock pulse CLK1 to the fourth clock pulse CLK4, as shown in FIG. 2. In addition, the forward direction voltage V_F has a high logic level (or a high status voltage), while the reverse direction voltage V_R has a low logic level (or a low status voltage). The number of the clock pulses is not limited to this. In other words, the clock pulses can be increased or decreased when they are necessary for the specifications of the dual shift register and the LCD device.

The operations of the first left and right stages a_ST1 and b_ST1 in an initial interval Ts of a first frame period will now be described.

The first AC voltage Vac1 has a positive polarity voltage and the second AC voltage Vac2 has a negative polarity voltage, during the first frame period. In the initial interval Ts, only the start pulse Vst among signals applied from a timing controller (not shown) maintains a high logic level (or a high status), as shown in FIG. 2. In other words, the clock pulses CLK1 through CLK4 corresponding to the residual signals output from the timing controller all have a low logic level (or a low status).

The start pulse Vst output from the timing controller is applied to the first left and right stages a_ST1 and b_ST1. More specifically, referring to FIG. 3 described as a kth stage, the start pulse Vst is applied to the first input terminal Vout (p−2) corresponding to the first output terminal of a previous stage. As such, the start pulse Vst is applied to the gate terminals of the first and second forward direction switching elements Tr_F1 and Tr_F2.

The first and second forward direction switching elements Tr_F1 and Tr_F2 are turned on by the start pulse Vst of the high logic level. Then, the forward direction voltage V_F with the high logic level is applied to the first set node Q1 via the first forward direction switching element Tr_F1 and charged into the first node Q1. As such, the first pull-up switching element Trup1, third switching element Tr3, sixth switching element Tr6, and fifteenth switching element Tr15, which each have the gate terminals connected to the first set node Q1, are turned on the charged voltage on the first node Q1.

The turned-on third switching element Tr3 enables the discharging voltage Vss to be applied to the first reset node QB1, thereby discharging the first reset node QB1. The discharged first reset node QB1 turns off the first and third pull-down switching element Trpd1 and thrpd3, first switching element Tr1, and ninth switching element Tr9 which each have the gate terminals connected to the first rest node QB1.

In addition, the fourth switching element Tr4 is turned-on by the first AC voltage Vac1 during the first frame period, because the first AC voltage Vac1 has the positive polarity voltage (i.e., the high logic level) during the first frame period. As such, the first AC voltage Vac1 is applied to the first common node CN1 through the fourth switching element Tr4. Therefore, the first common node CN1 is electrically connected to all the discharging voltage line Vss and first AC voltage line Vac1.

The turned-on sixth switching element Tr6 connecting the first common node CN1 to the discharging voltage line Vss is configured to have a larger size than that of the fourth switching element Tr4 connecting the first common node CN1 to the first AC voltage line Vac1. As such, a low logic voltage reaching near the discharging voltage Vss is charged into the first common node CN1. Furthermore, the first common node CN1 is doubly connected to the discharging voltage line Vss through the seventh switching element Tr7 which will be described below, so that the voltage on the first common node CN1 is discharged to have a much lower voltage level. The discharged voltage on the first common node CN1 turns off the fifth switching element Tr5 which includes the gate terminal connected to the first common node CN1.

Also, the second forward direction switching element Tr_F2 turned-on in the initial interval Ts enables the forward direction voltage V_F to be applied to the second set node Q2 and to be charged into the second set node Q2. The charged voltage on the second set node Q2 turns on all the second pull-up switching element Trpu2, seventh switching element Tr7, eleventh switching element Tr11, and fourteenth switching element Tr14 which each have the gate terminals connected to the second set node Q2.

The turned-on eleventh switching element Tr11 connects the discharging voltage line Vss with the second reset node QB2, so that the voltage on the second reset node QB2 is discharged. As such, the second and fourth pull-down switching elements Trpd2 and Trpd4, second switching element Tr2, and tenth switching element Tr10, which each have the gate terminals connected to the second reset node QB2, are turned-off.

Meanwhile, the second AC voltage has a negative polarity voltage (i.e., a low logic level) during the first frame period. As such, the twelfth switching element Tr12 receiving the second AC voltage Vac2 is turned-off during the first frame period. However, the turned-on fifteenth switching element Tr15 enables the discharging voltage Vss to be applied to the second common node CN2 through it, thereby discharging the voltage on the second common node CN2. The discharged voltage on the second common node CN2 turns off the thirteenth switching element Tr13 with the gate terminal connected to the second common node CN2.

Similarly to the turned-on first forward direction switching element Tr_F1, the control switching element Tr_C is also turned-on by the start pulse Vst in the initial interval Ts, so that the discharging voltage Vss is applied to the first reset node QB1. Therefore, the first reset node QB1 stably maintains a discharged voltage status. The discharged voltage on the first reset node QB1 turns off the first and ninth switching elements Tr1 and Tr9 and first and third pull-down switching elements Trpd1 and Trpd3 which are connected to the first reset node QB1.

The gate terminal of the eighth switching element Tr8 is connected to the third common node CN3 together with the gate terminal of the control switching element Tr_C. As such, the eighth switching element Tr8 is turned-on in the same manner as the control switching element Tr_C. The turned-on eighth switching element Tr8 applies the discharging voltage Vss to the second reset node QB2, thereby enabling the second reset node QB2 to stably maintain a discharged voltage status.

In this manner, the forward direction voltage V_F is charged in the first and second set nodes Q1 and Q2 within each of the first left and right stages a_ST1 and b_ST1 in the initial interval Ts. Also, the voltages on the first and second reset nodes QB1 and QB2 within each of the first left and right stages a_ST1 and b_ST1 is discharged in the initial interval Ts. Therefore, the first left and right stages positioned at the top portion of the dual shift register are enabled.

Subsequently, the operation of the dual shift register in a first interval T1 will be explained.

In the first interval, only the first clock pulse CLK1 has the high logic level (or the high status), as shown in FIG. 2. In other words, the start pulse Vst and the second and fourth clock pulses all have the low logic level (or the low status).

As the first set node Q1 within each of the first left and right stages a_ST1 and b_ST1 positioned at the top portion of the dual shift register maintains the high logic level (i.e., the high status), the first pull-up switching element Trpu1 within each of the first top-left and top-right stages a_ST1 and b_ST1 is in the turned-on status. When the first clock pulse CLK1 of a high logic level is applied to the drain terminal of the first pull-up switching element Trpu1, the charged voltage on the first set node Q1 within each of the first top-left and top right stages a_ST1 and b_ST1 which are in a floating status is bootstrapped by the first pull-up switching element Trpu1.

Therefore, the first clock pulse CLK1 is stably output to the first output terminal 10a through the drain and source terminals of the first pull-up switching element Trpu1 within each of the first top-left and top-right stages a_ST1 and b_ST1. The first clock pulse CLK1 applied to the first output terminal 10a via the first pull-up switching element Trpu1 is output as a first scan pulse Vout1. The first scan pulse Vout1 is applied to a first gate line and the second left and right stages a_ST2 and b_ST2. As such, the first gate line is driven and the second left and right stages a_ST2 and b_ST2 are enabled, in the first interval T1.

The enabling operations of the second left and right stages a_ST2 and b_ST2 in the first interval T1 are performed in the same as the enabling operations of the first left and right stages a_ST1 and b_ST1 in the initial interval Ts as described above. Therefore, the enabling operations of the second left and right stages a_ST2 and b_ST2 will be omitted.

Continuously, the operation of the dual shift register in a second interval T2 will now be described.

In the second interval, the first and second clock pulses CLK1 and CLK2 each have the high logic level (or the high status), and the start pulse Vst and the residual clock pulses CLK3 and CLK4 all have the low logic level (i.e., the low status).

The first scan pulse Vout1 continuously maintains the high logic level (i.e., an enabled status), because the first clock pulse CLK1 is applied to the first output terminal 10a via the first pull-up switching element Trpu1 within each of the first left and right stages a_ST1 and b_ST1. As such, the second left and right stages a_ST2 and b_ST2 continuously perform the enabling operation by the first scan pulse Vout1 in the second interval.

The second clock pulse CLK2 forces the second pull-up switching element Trpu2 within each of the first left and right stages a_ST1 and b_ST1 to output a second scan pulse Vout2.

More specifically, the second pull-up switching element Trpu2 within each of the first left and right stages a_ST1 and b_ST1 continuously stays in the turned-on status, because the second set node Q2 within each of the first left and right stages a_ST1 and b_ST1 continuously maintains the voltage charged in the initial interval Ts. When the second clock pulse CLK2 of a high logic level is applied to the drain terminal of the turned-on second pull-up switching element Trpu2, the charged voltage on the second set node Q2 within each of the first top-left and top right stages a_ST1 and b_ST1 which is in a floating status is bootstrapped by the second pull-up switching element Trpu2. Therefore, the second clock pulse CLK2 is stably output to the second output terminal 10b through the drain and source terminals of the second pull-up switching element Trpu2 within each of the first left and right stages a_ST1 and b_ST1. The second clock pulse CLK2 applied to the second output terminal 10b via the second pull-up switching element Trpu2 is used as a second scan pulse Vout2. The second scan pulse Vout2 is applied to a second gate line, thereby driving the second gate line.

Next, the operation of the dual shift register in a third interval T3 will be explained.

In the third interval T3, the second and third clock pulses CLK2 and CLK3 have the high logic level (i.e., the high status), and the start pulse Vst and the residual clock pulses CLK1 and CLK4 all have the low logic level (i.e., the low status).

The second scan pulse Vout2 continuously maintains the high logic level (i.e., an enabled status), because the second clock pulse CLK2 is applied to the second output terminal 10b via the second pull-up switching element Trpu2 within each of the first left and right stages a_ST1 and b_ST1. The third clock pulse CLK3 forces the first pull-up switching element Trpu1 within each of the second left and right stages a_ST2 and b_ST2 to output a third scan pulse Vout3.

The third scan pulse Vout3 from the first output terminal 10a within each of the second left and right stages a_ST2 and b_ST2 is applied to a third gate line and the third left and right stages a_ST3 and b_ST3. As such, the third gate line is driven and the third left and right stages a_ST3 and b_ST3 are enabled, in the third interval T3.

Finally, the operation of the dual shift register in a fourth interval T4 will now be described.

In the fourth interval T4, the third and fourth clock pulses CLK3 and CLK4 have the high logic level (i.e., the high status), and the start pulse Vst and the residual clock pulses CLK1 and CLK2 all maintain the low logic level (i.e., the low status).

The third scan pulse Vout3 continuously maintains the high logic level (i.e., an enabled status), because the third clock pulse CLK3 is applied to the first output terminal 10a via the first pull-up switching element Trpu1 within each of the second left and right stages a_ST2 and b_ST2. The third scan pulse Vout3 is applied to the third gate line and the third left and right stages a_ST3 and b_ST3. Meanwhile, the fourth clock pulse CLK4 forces the second pull-up switching element Trpu2 within each of the second left and right stages a_ST2 and b_ST2 to output a fourth scan pulse Vout4. The fourth scan pulse Vout4 is applied to a fourth gate line and the first left and right stages a_ST1 and b_ST1. As such, the fourth gate line is driven and the first left and right stages a_ST1 and b_ST1 are disabled.

The disabling operation of each of the first left and right stages a_ST1 and b_ST1 will be explained in detail.

The four scan pulse Vout4 is applied to the gate terminals of the first and second reverse direction switching elements Tr_R1 and Tr_R2 within each of the first left and right stages a_ST1 and b_ST1. As such, the first and second reverse direction switching elements Tr_R1 and Tr_F2 are turned-on.

Then, the reverse direction voltage V_R with the low logic level (i.e., the low status) is applied to the first set node Q1 within each of the first left and right stages a_ST1 and b_ST1 through the turned-on first reverse direction switching element Tr_R1, thereby discharging the voltage on the first set node Q1. Therefore, the first pull-up switching element Trpu1, third switching element Tr3, sixth switching element Tr6, and fifteenth switching element Tr15, which each include the gate terminals connected to the discharged first set node Q1, are all turned-off.

Also, the reverse direction voltage V_R with the low logic level (i.e., the low status) is applied to the second set node Q2 within each of the first left and right stages a_ST1 and b_ST1 through the turned-on second reverse direction switching element Tr_R2, thereby discharging the voltage on the second set node Q2. Therefore, the second pull-up switching element Trpu2, seventh switching element Tr7, eleventh switching element Tr11, and fourteenth switching element Tr14, which each include the gate terminals connected to the turned-on second set node Q2, are all turned-off.

Meanwhile, the control switching element Tr_C and eighth switching element Tr8, which each include the gate terminals connected to the third common node CN3, are also turned-off.

As the sixth and seventh switching elements Tr6 and Tr7 within each of the first left and right stages a_ST1 and b_ST1 are turned-off, the first AC voltage Vac1 is applied to the first common node CN1 within each of the first left and right stages a_ST1 and b_ST1 via the fourth switching element Tr4, and is charged into the first common node CN1. Then, the fifth switching element Tr5 with the gate terminal connected to the charged first common node CN1 is turned-on, so that the first AC voltage Vac1 is applied to the first reset node QB1 within each of the first left and right stages a_ST1 and b_ST1 via the turned-on fifth switching element Try. As such, the first reset node QB1 is charged with the first AC voltage Vac1. The charged voltage on the first reset node QB1 turns on the first and third pull-down switching elements Trpd1 and Trpd3 and first and ninth switching elements Tr1 and Tr9 which are included in each of the first left and right stages a_ST1 and b_ST1 and which each include the gate terminal connected to the first reset node QB1.

The turned-on first switching element Tr1 forces the discharging voltage Vss to be applied to the first set node Q1 within each of the first left and right stages a_ST1 and b_ST1, so that the first set node Q1 maintains a more stable discharge status. Also, the turned-on ninth switching element Tr9 allows the discharging voltage Vss to be applied to the second set node Q2 within each of the first left and right stages a_ST1 and b_ST1, so that the second set node Q2 maintains a more stable discharge status.

The voltages on the first and second set nodes Q1 and Q2 within each of the first left and right stages a_ST1 and b_ST1 are discharged in the fourth interval T4. Also, the first reset node QB1 is charged with the first AC voltage Vac1 in the fourth interval T4. The second reset node QB2 continues to maintain the voltage-discharged status. Therefore, the first left and right stages a_ST1 and b_ST1 are disabled.

Consequently, the first and third pull-down switching elements Trpd1 and Trpd2 within each of the first left and right stages a_ST1 and b_ST1 are turned-on in the fourth interval T4. As such, the discharging voltage Vss is applied to the first gate line and the second left and right stages a_ST2 and b_ST2 via the first pull-down switching element Trpd1 and the first output terminal 10a, as a first scan pulse with the low logic level. Also, the discharging voltage Vss is applied to the second gate line via the third pull-down switching element Trpd3 and the second output terminal 10b, as a second scan pulse with the low logic level.

The residual stages a_ST2~a_STn and a_ST2~b_STn are sequentially driven in the same manner as the first left and right stages a_ST1 and b_ST1.

Moreover, the first AC voltage Vac1 has the negative polarity voltage (i.e., the low logic level) instead of the positive polarity voltage, and the second AC voltage Vac2 has the positive polarity voltage (i.e., the high logic level) instead of the negative polarity voltage, during a second frame period. As such, the first reset node QB1 within each of the left and right stages a_ST1~a_STn and b_ST1~b_STn continues to maintain the voltage-discharged status. On the contrary, the second reset node QB2 within each of the left and right stages a_ST1~a_STn and b_ST1~b_STn is charged with the second AC voltage Vac2 in the disabling interval. Therefore, only the second and fourth pull-down switching elements Trpd2 and Trpd4 within each of the left and right stages a_ST1~a_STn and b_ST1~b_STn are driven during the disabled period of the second frame period.

Figure 4:
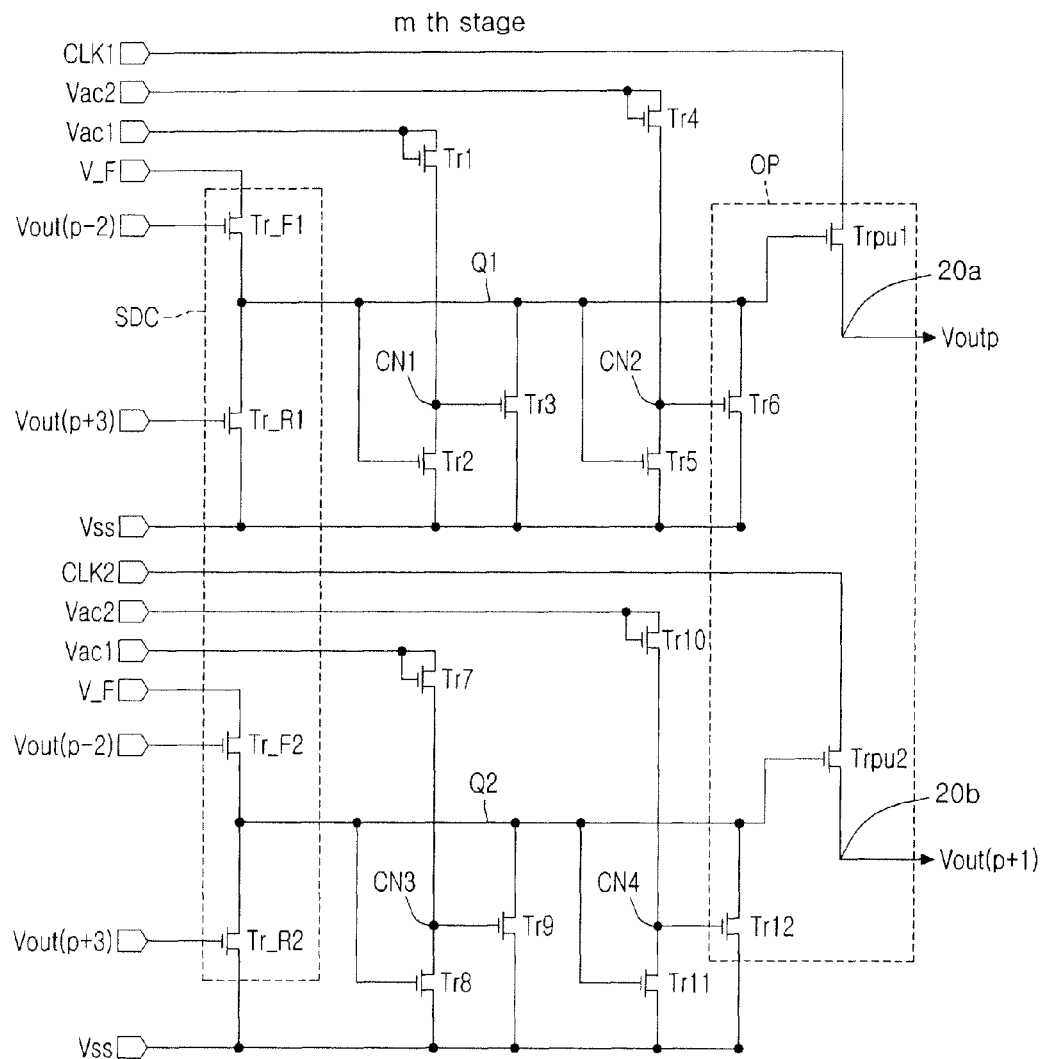
FIG. 4 is a circuit diagram showing the configuration of a Y-type stage among stages included in the dual shift register of FIG. 1.

FIG. 4 is a circuit diagram showing the configuration of a Y-type stage among stages included in the dual shift register of FIG. 1.

The Y-type stage shown in FIG. 4 can be applied to any one of the left and right stages included in each stage pair. The Y-type stage includes a node controller, a scan direction controller SDC, and an output portion OP. The Y-type stage of FIG. 4 can be used as any one of an mth left and right stages. The node controller can include first through twelfth switching elements Tr1 through Tr12. The character "m" is an arbitrary natural number.

The third switching element Tr3 included in the mth stage is turned on/off depending upon the status of a signal on a first common node CN1. Also, the third switching element Tr3 is connected between a first set node Q1 and a discharging voltage line Vss. Such a third switching element Tr3 within the mth stage includes a gate terminal connected to the first common node CN1, a drain terminal connected to the first set node Q1, and a source terminal connected to the discharging voltage line Vss.

The second switching element Tr2 included in the mth stage is turned on/off depending upon the status of a signal on a first set node Q1. Also, the second switching element Tr2 is connected between the first common node CN1 and the discharging voltage line Vss. Such a second switching element Tr2 within the mth stage includes a gate terminal connected to the first set node Q1, a drain terminal connected to the first common node CN1, and a source terminal connected to the discharging voltage line Vss.

The first switching element Tr1 included in the mth stage is turned on/off depending upon a first AC voltage Vac1 from a first AC voltage line Vac1. Also, the first switching element Tr1 is connected between the first AC voltage line Vac1 and the first common node CN1. Such a first switching element Tr1 within the mth stage includes gate and drain terminals, which are connected to the first AC voltage line Vac1, and a source terminal connected to the first common node CN1.

The fourth switching element Tr4 included in the mth stage is turned on/off depending upon a second AC voltage Vac2 from a second AC voltage line Vac2. Also, the fourth switching element Tr4 is connected between the second AC voltage line Vac2 and a second common node CN2. Such a fourth switching element Tr4 within the mth stage includes gate and drain terminals, which are connected to the second AC voltage line Vac2, and a source terminal connected to the second common node CN2.

The fifth switching element Tr5 included in the mth stage is turned on/off depending upon the status of the signal on the first set node Q1. Also, the fifth switching element Tr5 is connected between the second common node CN2 and the discharging voltage line Vss. Such a fifth switching element Tr5 within the mth stage includes a gate terminal connected to the first set node Q1, a drain terminal connected to the second common node CN2, and a source terminal connected to the discharging voltage line Vss.

The sixth switching element Tr6 included in the mth stage is turned on/off depending upon the status of a signal supplied from the second common node CN2. Also, the sixth switching element Tr6 is connected between the first set node Q1 and the discharging voltage line Vss. Such a sixth switching element Tr6 within the mth stage includes a gate terminal connected to the second common node CN2, a drain terminal connected to the first set node Q1, and a source terminal connected to the discharging voltage line Vss.

The seventh switching element Tr7 included in the mth stage is turned on/off depending upon the first AC voltage Vac1 supplied from the first AC voltage line Vac1. Also, the seventh switching element Tr7 is connected between the first AC voltage line Vac1 and a third common node CN3. Such a seventh switching element Tr7 within the mth stage includes gate and drain terminals, which are connected to the first AC voltage line Vac1, and a source terminal connected to the third common node CN3.

The eighth switching element Tr8 included in the mth stage is turned on/off depending upon the status of a signal applied from a second set node Q2. Also, the eighth switching element Tr8 is connected between the third common node CN3 and the discharging voltage line Vss. Such an eighth switching element Tr8 within the mth stage includes a gate terminal connected to the second set node Q2, a drain terminal connected to the third common node CN3, and a source terminal connected to the discharging voltage line Vss.

The ninth switching element Tr9 included in the mth stage is turned on/off depending upon the status of a signal supplied from the third common node CN3. Also, the ninth switching element Tr9 is connected between the second set node Q2 and the discharging voltage line Vss. Such a ninth switching element Tr9 within the mth stage includes a gate terminal connected to the third common node CN3, a drain terminal connected to the second set node Q2, and a source terminal connected to the discharging voltage line Vss.

The tenth switching element Tr10 included in the mth stage is turned on/off depending upon the second AC voltage Vac2 supplied from the second AC voltage line Vac2. Also, the tenth switching element Tr10 is connected between the second AC voltage line Vac2 and a fourth common node CN4. Such a tenth switching element Tr10 within the mth stage includes gate and drain terminals, which are connected to the second AC voltage line Vac2, and a source terminal connected to the fourth common node CN4.

The eleventh switching element Tr11 included in the mth stage is turned on/off depending upon the status of the signal applied from the second set node Q2. Also, the eleventh switching element Tr11 is connected between the fourth common node CN4 and the discharging voltage line Vss. Such an eleventh switching element Tr11 within the mth stage includes a gate terminal connected to the second set node Q2, a drain terminal connected to the fourth common node CN4, and a source terminal connected to the discharging voltage line Vss.

The twelfth switching element Tr12 included in the mth stage is turned on/off depending upon the status of a signal supplied from the fourth common node CN4. Also, the twelfth switching element Tr12 is connected between the second set node Q2 and the discharging voltage line Vss. Such a twelfth switching element Tr12 within the mth stage includes a gate terminal connected to the fourth common node CN4, a drain terminal connected to the second set node Q2, and a source terminal connected to the discharging voltage line Vss.

The scan direction controller SDC includes first and second forward direction switching elements Tr_F1 and Tr_F2 and first and second reverse direction switching elements Tr_R1 and Tr_R2. Also the scan direction controller SDC can further include a control switching element Tr_C.

The first forward direction switching element Tr_F1 included in the mth stage is turned on/off depending upon the former scan pulse Vout(p−2) of two sequential scan pulses which are output from the (m−1)th stage. Also, the first forward direction switching element Tr_F1 is connected between a forward direction voltage line V_F and the first set node Q1. Such a first forward direction switching element Tr_F1 within the mth stage includes a gate terminal connected to a first output terminal 20a of the (m−1)th stage, a drain terminal connected to the forward direction voltage line V_F, and a source terminal connected to the first set node Q1.

The first reverse direction switching element Tr_R1 included in the mth stage is turned on/off depending upon the latter scan pulse Vout(p+3) of two sequential scan pulses which are output from the (m+1)th stage. Also, the first reverse direction switching element Tr_R1 is connected between the first set node Q1 and the discharging voltage line Vss. Such a first reverse direction switching element Tr_R1 includes a gate terminal connected to a second output terminal 20b of the (m+1)th stage, a drain terminal connected to the first set node Q1, and a source terminal connected to the discharging voltage line Vss.

The second forward direction switching element Tr_F2 included in the mth stage is turned on/off depending upon the former scan pulse Vout(p−2) of two sequential scan pulses which are output from the (m−1)th stage. Also, the second forward direction switching element Tr_F2 is connected between the forward direction voltage line V_F and the second set node Q2. Such a second forward direction switching element Tr_F2 within mth stage includes a gate terminal connected to the first output terminal 20a of the (m−1)th stage, a drain terminal connected to the forward direction voltage line V_F, and a source terminal connected to the second set node Q2.

The second reverse direction switching element Tr_R2 included in the mth stage is turned on/off depending upon the latter scan pulse Vout(p+3) of two sequential scan pulses which are output from the (m+1)th stage. Also, the second reverse direction switching element Tr_R2 is connected between the second set node Q2 and the discharging voltage line Vss. Such a second reverse direction switching element Tr_R2 within the mth stage includes a gate terminal connected to a second output terminal 20b of the (m+1)th stage, a drain terminal connected to the second set node Q2, and a source terminal connected to the discharging voltage line Vss.

The output portion OP includes first and second pull-up switching elements Trpu1 and Trpu2.

The first pull-up switching element Trpu1 is turned on/off depending upon the status of the signal on the first set node Q1. Also, the first pull-up switching element Trpu1 is connected between one of the clock transmission lines CLK1 through CLK4, which are used for transferring the clock pulses CLK1 through CLK4, and a first output terminal 20a. Such a first pull-up switching element Trpu1 includes a gate terminal connected to the first set node Q1, a drain terminal connected to one of the clock transmission lines CLK1 through CLK4, and a source terminal connected to the first output terminal 20a.

The second pull-up switching element Trpu2 is turned on/off depending upon the status of the signal on the second set node Q2. Also, the second pull-up switching element Trpu2 is connected between another one of the clock transmission lines CLK1 through CLK4, which are used for transferring the clock pulses CLK1 through CLK4, and a second output terminal 20b. Such a second pull-up switching element Trpu2 includes a gate terminal connected to the second set node Q2, a drain terminal connected to another one of the clock transmission lines CLK1 through CLK4, and a source terminal connected to the second output terminal 20b.

Such a Y-type stage is driven in the same manner as the above X-type stage described referring to FIGS. 1 through 3. However, the Y-type stage of FIG. 4 has no the pull-down switching elements unlike the X-type stage of FIG. 3. As such, the Y-type stage enables the clock pulses to be output through the first and second output terminals 20a and 20b, only when the first and second set nodes Q1 and Q2 are charged with the high logic voltage. Nevertheless, the outputting procedure of the clock pulses in the Y-type stage is performed in the same principle as that of the output portion in FIG. 3.

In view of this point, the Y-type stage can be disposed at one of the left and right ends of one gate line pair, in order to form one stage pair together with the X-type stage of FIG. 3. If the X-type stage is positioned at the left end of one gate line pair, the Y-type stage is disposed at the right end of the gate line pair and supplies the gate line pair with two sequential scan pulses which are the same as those output from the X-type stage. On the contrary, the Y-type stage can be disposed at the left end of one gate line pair, when the X-type stage is positioned at the right end of the gate line pair. In this case, the Y-type stage supplies the gate line pair with two sequential scan pulses which are the same as those output from the X-type stage.

Furthermore, the Y-type stages are arranged alternately with the X-type stages in a perpendicular direction to the gate lines. In this case, the enabling and disabling procedures between the adjacent X-type and Y-type stages in a top-bottom direction are performed in the same manner as those between the adjacent X-type stages described in FIGS. 1 through 3.

In this way, the Y-type stage can decrease switching elements below a half of the X-type stage. Therefore, the design area can be reduced.

Figure 5:
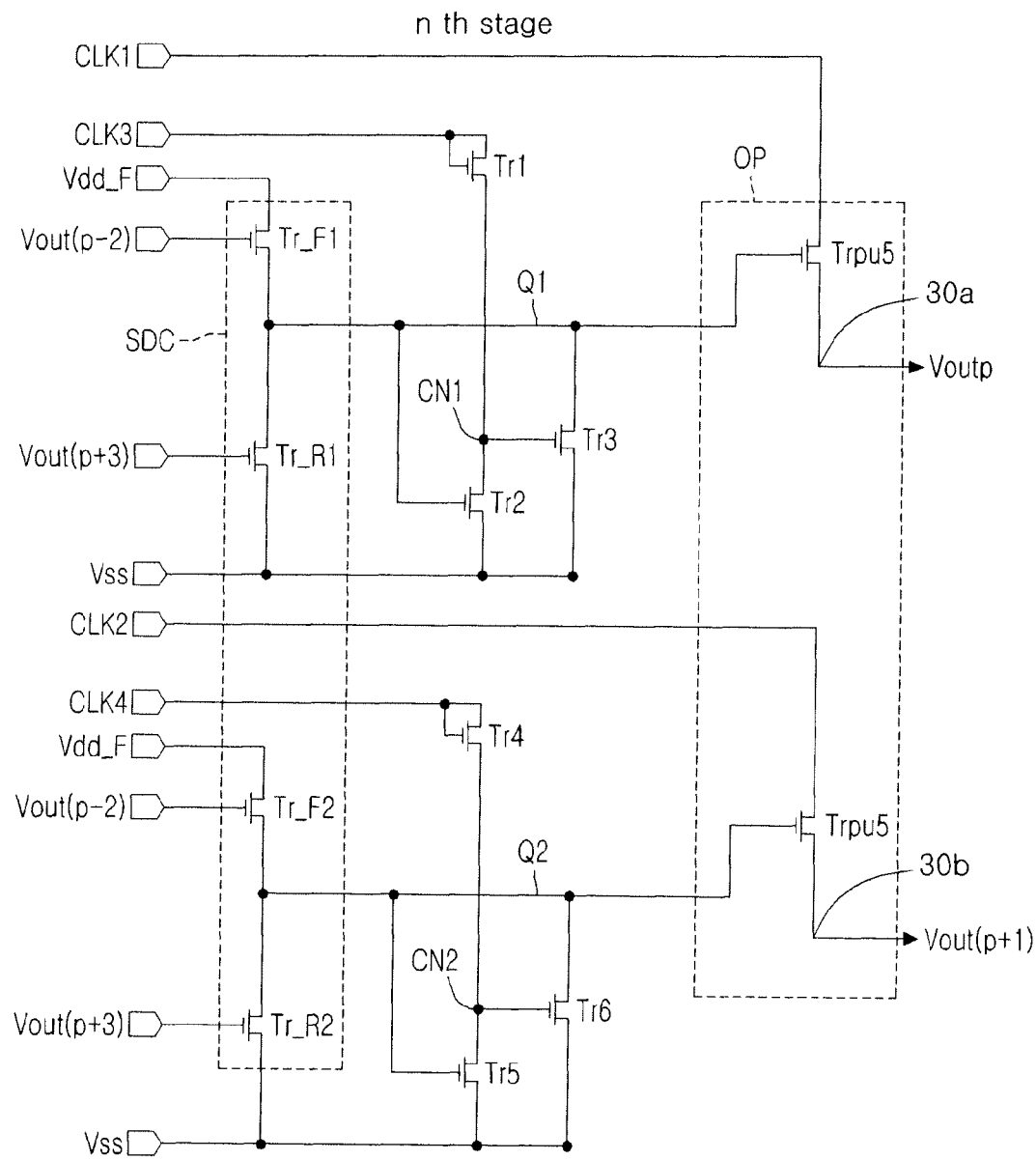
FIG. 5 is a circuit diagram showing the configuration of a Z-type stage among stages included in the dual shift register of FIG. 1.

FIG. 5 is a circuit diagram showing the configuration of a Z-type stage among stages included in the dual shift register of FIG. 1.

The Z-type stage shown in FIG. 5 can be applied to any one of the left and right stages included in each stage pair. The Z-type stage includes a node controller, a scan direction controller SDC, and an output portion OP.

If, the Z-type stage of FIG. 5 can be used as any one of nth left and right stages, The node controller can include first through sixth switching elements Tr1 through Tr6. The Z-type stage uses only the clock pulses as control and output signals without the above AC voltages Vac1 and Vac2. As such, the Z-type stage is connected to all the clock transmission lines CLK1 through CLK4 which are provided in the dual shift register. More specifically, any two of the clock pulses CLK1 through CLK4 are used to control the Z-type stage, and the residual clock pulses are used to generate output signals (the two sequential scan pulses) in the Z-type stage. The character "n" is an arbitrary natural number.

The first switching element Tr1 included in the nth stage is turned on/off depending upon a clock pulse applied from one of the clock transmission lines (for example, a third clock transmission line CLK3). Also, the first switching element Tr1 is connected between one of the clock transmission lines and the first common node CN1. Such a first switching element Tr1 within the nth stage includes gate and drain terminals, which are connected to one of the clock transmission lines, and a source terminal connected to the first common node CN1.

The second switching element Tr2 included in the nth stage is turned on/off depending upon the status of a signal applied from a first set node Q1. Also, the second switching element Tr2 is connected between the first common node CN1 and a discharging voltage line Vss. Such a second switching element Tr2 within the nth stage includes a gate terminal connected to the first set node Q1, a drain terminal connected to the first common node CN1, and a source terminal connected to the discharging voltage line Vss.

The third switching element Tr3 included in the nth stage is turned on/off depending upon the status of a signal supplied from the first common node CN1. Also, the third switching element Tr3 is connected between the first set node Q1 and the discharging voltage line Vss. Such a third switching element Tr3 within the nth stage includes a gate terminal connected to the first common node CN1, a drain terminal connected to the first set node Q1, and a source terminal connected to the discharging voltage line Vss.

The fourth switching element Tr4 included in the nth stage is turned on/off depending upon another clock pulse from another one of the clock transmission lines (for example, a fourth clock transmission line CLK2). Also, the fourth switching element Tr4 is connected between another one of the clock transmission lines and the second common node CN2. Such a fourth switching element Tr4 within the nth stage includes gate and drain terminals, which are connected to another one of the clock transmission lines, and a source terminal connected to the second common node CN2.

The fifth switching element Tr5 included in the nth stage is turned on/off depending upon the status of a signal applied from a second set node Q2. Also, the fifth switching element Tr5 is connected between the second common node CN2 and a discharging voltage line Vss. Such a fifth switching element Tr5 within the nth stage includes a gate terminal connected to the second set node Q2, a drain terminal connected to the second common node CN2, and a source terminal connected to the discharging voltage line Vss.

The sixth switching element Tr6 included in the nth stage is turned on/off depending upon the status of a signal supplied from the second common node CN2. Also, the sixth switching element Tr6 is connected between the second set node Q2 and the discharging voltage line Vss. Such a sixth switching element Tr6 within the nth stage includes a gate terminal connected to the second common node CN2, a drain terminal connected to the second set node Q2, and a source terminal connected to the discharging voltage line Vss.

The scan direction controller SDC includes first and second forward direction switching elements Tr_F1 and Tr_F2 and first and second reverse direction switching elements Tr_R1 and Tr_R2. Also the scan direction controller SDC can further include a control switching element Tr_C.

The first forward direction switching element Tr_F1 included in the nth stage is turned on/off depending upon the former scan pulse Vout(p−2) of two sequential scan pulses which are output from the (n−1)th stage. Also, the first forward direction switching element Tr_F1 is connected between a forward direction voltage line V_F and the first set node Q1. Such a first forward direction switching element Tr_F1 within the nth stage includes a gate terminal connected to a first output terminal 30a of the (n−1)th stage, a drain terminal connected to the forward direction voltage line V_F, and a source terminal connected to the first set node Q1.

The first reverse direction switching element Tr_R1 included in the nth stage is turned on/off depending upon the latter scan pulse Vout(p+3) of two sequential scan pulses which are output from the (n+1)th stage. Also, the first reverse direction switching element Tr_R1 is connected between the first set node Q1 and the discharging voltage line Vss. Such a first reverse direction switching element Tr_R1 within the nth stage includes a gate terminal connected to a second output terminal 30b of the (n+1)th stage, a drain terminal connected to the first set node Q1, and a source terminal connected to the discharging voltage line Vss.

The second forward direction switching element Tr_F2 included in the nth stage is turned on/off depending upon the former scan pulse Vout(p−2) of two sequential scan pulses which are output from the (n−1)th stage. Also, the second forward direction switching element Tr_F2 is connected between the forward direction voltage line V_F and the second set node Q2. Such a second forward direction switching element Tr_F2 within the nth stage includes a gate terminal connected to the first output terminal 30a of the (n−1)th stage, a drain terminal connected to the forward direction voltage line V_F, and a source terminal connected to the second set node Q2.

The second reverse direction switching element Tr_F2 included in the nth stage is turned on/off depending upon the latter scan pulse Vout(p+3) of two sequential scan pulses which are output from the (n+1)th stage. Also, the second reverse direction switching element Tr_R2 is connected between the second set node Q2 and the discharging voltage line Vss. Such a second reverse direction switching element Tr_R2 within the nth stage includes a gate terminal connected to a second output terminal 30b of the (n+1)th stage, a drain terminal connected to the second set node Q2, and a source terminal connected to the discharging voltage line Vss.

The output portion OP includes first and second pull-up switching elements Trpu1 and Trpu2.

The first pull-up switching element Trpu1 is turned on/off depending upon the status of the signal on the first set node Q1. Also, the first pull-up switching element Trpu1 is connected between still another one (for example, a first clock transmission line CLK1) of the clock transmission lines, which are used for transferring the clock pulses CLK1 through CLK4, and a first output terminal 30a. Such a first pull-up switching element Trpu1 includes a gate terminal connected to the first set node Q1, a drain terminal connected to still another one of the clock transmission lines, and a source terminal connected to the first output terminal 30a.

The second pull-up switching element Trpu2 is turned on/off depending upon the status of the signal on the second set node Q2. Also, the second pull-up switching element Trpu2 is connected between further still another one (for example, a second clock transmission line CLK2) of the clock transmission lines, which are used for transferring the clock pulses CLK1 through CLK4, and a second output terminal 30b. Such a second pull-up switching element Trpu2 includes a gate terminal connected to the second set node Q2, a drain terminal connected to further still another one of the clock transmission lines, and a source terminal connected to the second output terminal 30b.

Such a Z-type stage is driven in the same manner as the above X-type stage described referring to FIGS. 1 through 3. However, the Z-type stage of FIG. 5 has no the pull-down switching elements unlike the X-type stage of FIG. 3. As such, the Z-type stage enables the clock pulses to be output through the first and second output terminals 30a and 30b, only when the first and second set nodes Q1 and Q2 are charged with the high logic voltage. Nevertheless, the outputting procedure of the clock pulses in the Z-type stage is performed in the same principle as that of the output portion in FIG. 3.

In view of this point, the Z-type stage can be disposed at one of the left and right ends of one gate line pair, in order to form one stage pair together with the X-type stage of FIG. 3. If the X-type stage is positioned at the left end of one gate line pair, the Z-type stage is disposed at the right end of the gate line pair and supplies the gate line pair with two sequential scan pulses which are the same as those output from the X-type stage. On the contrary, the Z-type stage can be disposed at the left end of one gate line pair, when the X-type stage is positioned at the right end of the gate line pair. In this case, the Z-type stage supplies the gate line pair with two sequential scan pulses which are the same as those output from the X-type stage.

Furthermore, the Z-type stages are arranged alternately with the X-type stages in a perpendicular direction to the gate lines. In this case, the enabling and disabling procedures between the adjacent X-type and Z-type stages in a top-bottom direction are performed in the same manner as those between the adjacent X-type stages described in FIGS. 1 through 3.

In this way, the Z-type stage according to another embodiment of the present disclosure can decrease switching elements below a half of the X-type stage in FIG. 3. Therefore, the design area can be reduced.

Figure 6:
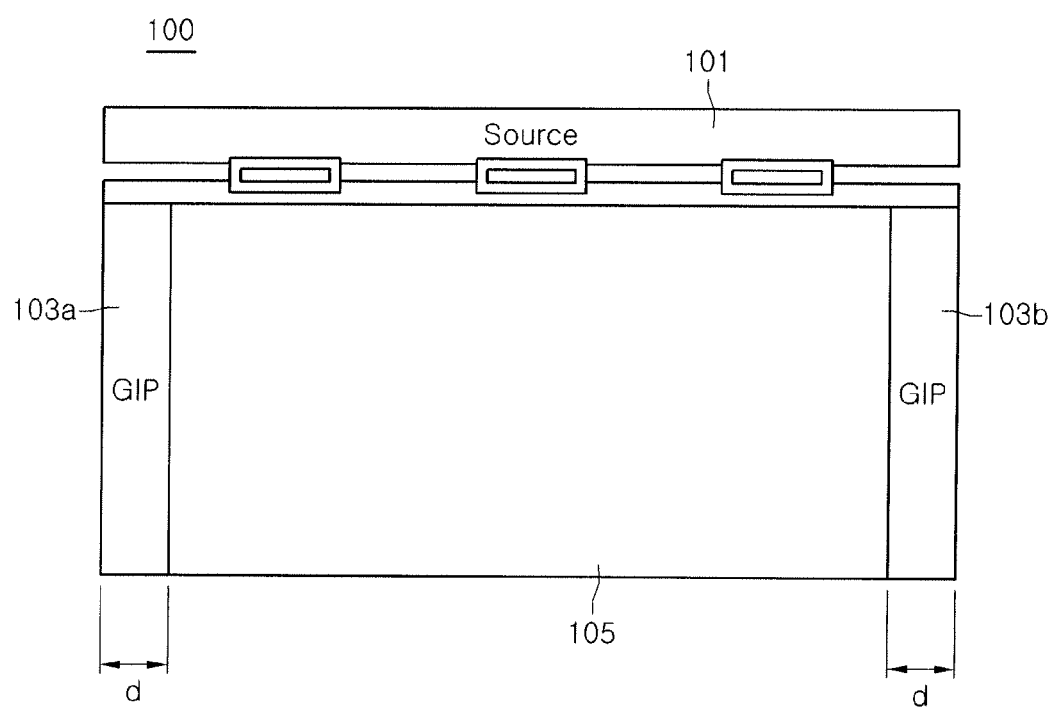
FIG. 6 is a block diagram showing the configuration of an LCD device according to an embodiment of the present disclosure.
Figure 7:
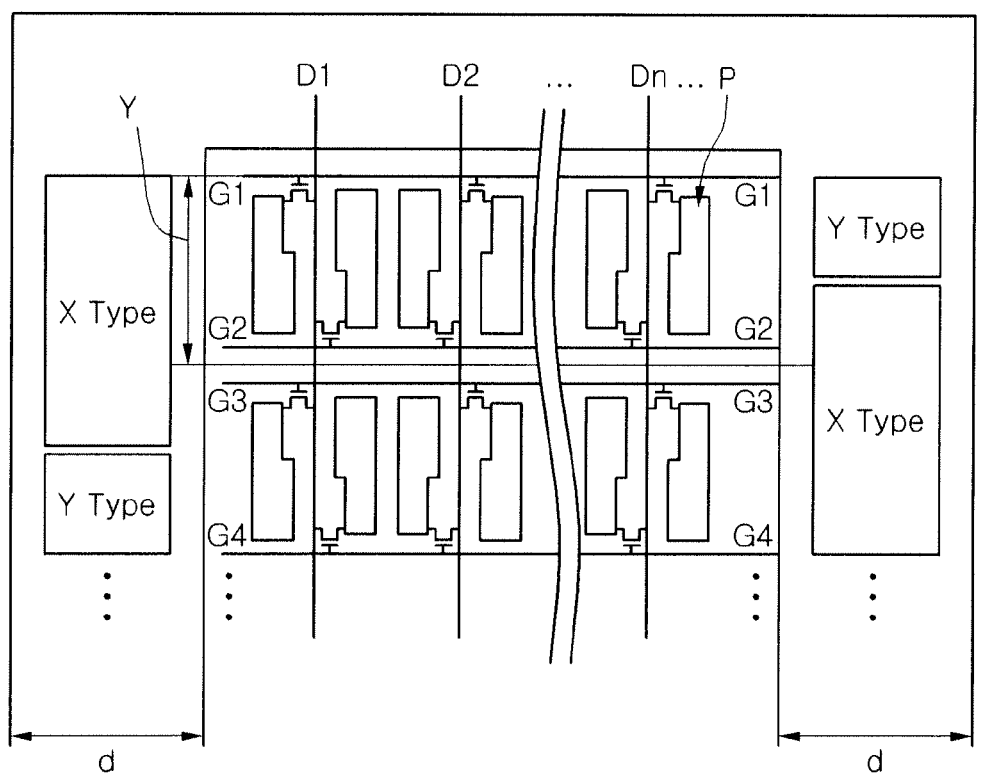
FIGS. 7 and 8 block diagrams showing shapes of the dual shift register mounted on an LCD panel within an LCD device.
Figure 8:
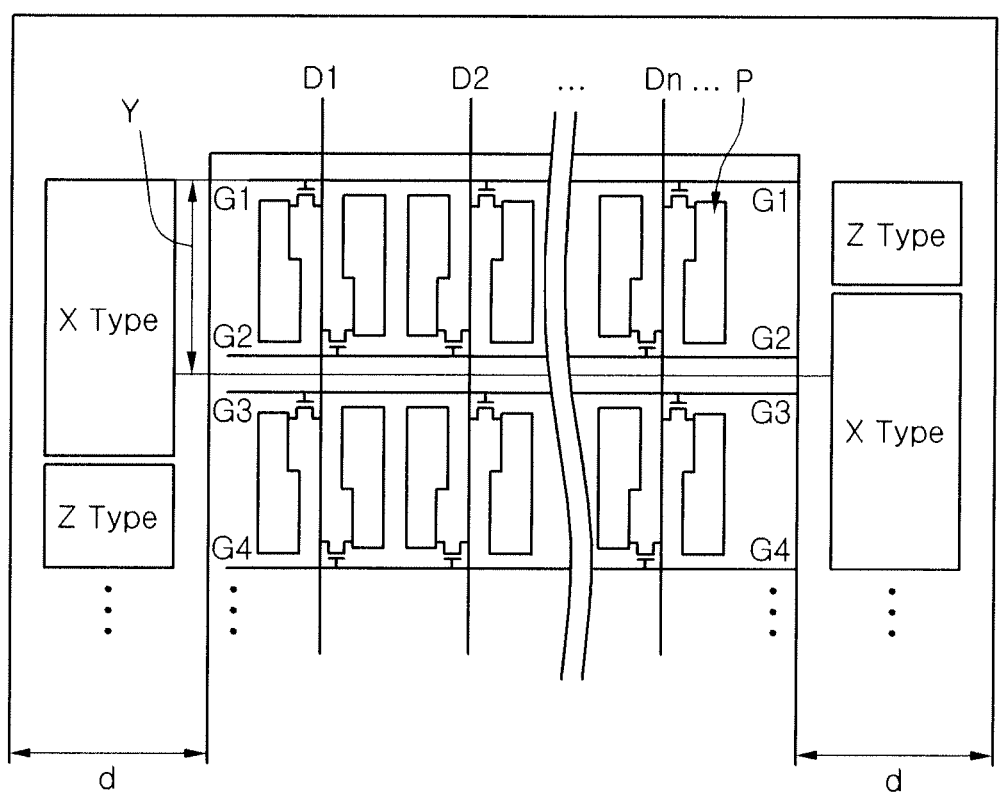

FIG. 6 is a block diagram showing the configuration of an LCD device according to an embodiment of the present disclosure. FIGS. 7 and 8 block diagrams showing shapes of the dual shift register mounted on an LCD panel within an LCD device.

As shown in FIG. 6, the LCD device includes a source driver 101, gate drivers 103a and 103b, and an LCD panel 105.

The LCD device of the present embodiment allows the three type stages of FIGS. 3 through 5 to be selectively included in the gate drivers 103a and 103b and to be driven. More specifically, the X-type stage of FIG. 3 is always included in one of the left and right gate drivers 103a and 103b, the Y-type of FIG. 4 or Z-type stages of FIG. 5 is selectively included in the other gate driver and opposite the X-type stage.

The Y-type and Z-type stages each include switching elements below a half of the X-type stage, as described in FIGS. 4 and 5. As such, the gate drivers 103a and 103b loaded on the LCD panel 105 each have a reduced width "d" in comparison with those of the related art LCD panel.

As shown in FIG. 7, if a left stage opposite to first and second gate lines is the X-type stage, the Y-type stage is disposed at the right ends of the first and second gate lines. Also, when another left stage opposite to third and fourth gate lines is the Y-type stage of FIG. 4, the X-type stage of FIG. 3 is disposed at the right ends of the third and fourth gate lines.

In this manner, the X-type stage of FIG. 3 and the Y-type stage are arranged opposite each other in the center of the gate line and alternately with each other in a perpendicular direction to the gate line. In other words, the X-type and Y-type stages are all arranged in zigzag shapes opposite to each other. Therefore, the design area can be sufficiently secured.

The height of the X-type stage of FIG. 3 is larger than that of the Y-type stage of FIG. 4, as shown in FIG. 7. Also, the height of the X-type stage is larger than a distance "Y" between the gate lines G1 and G2, but the height of the Y-type stage is smaller than the distance "Y" between the gate lines G1 and G2. As such, the zigzag arrangement of the X-type and Y-type stages enables the height and width of the dual shift register on the LCD panel to be reduced. In other words, the occupying area of the dual shift register on the LCD panel can be reduced. Therefore, the dual shift register of the present embodiment can be applied to a high definition model without enlarging the LCD device. Although they are shown in the drawings, "P" and "D1, D2, . . . , DN" not explained represent a pixel electrode and data lines, respectively.

Also, among the stages connected the gate lines, the stage with less number of switching elements LCD device are disposed opposite each of the gate lines G1~G4. As such, the load applied to each of the gate lines can be minimized. The load reduction of the gate line allows the driving voltage to be stably supplied to the gate line.

Similarly, the Z-type stage of FIG. 5 is disposed to form one stage pair together with the X-type stage, on an LCD panel, as shown in FIG. 8. Also, the Z-type stage includes switching elements below a half in comparison with the X-type stage. Therefore, the design area can be largely reduced, and the load applied to the gate line can be reduced.

As described above, the dual shift registers according to embodiments of the present disclosure include less number of switching elements in comparison with the related art shift register. Nevertheless, the dual shift registers can output the same gate driving voltage as the related art shift register.

Also, the dual shift registers according to embodiments of the present disclosure are driven selectively using a part of input signal applied to the related art shift register. As such, an additional signal generator is not necessary for the dual shift register.

Moreover, the dual shift registers according to embodiment of the present disclosure are implemented less number of switching elements. As such, their occupying area on the LCD panel can be largely reduced, and the load applied to each of the gate lines can be reduced.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A dual shift register comprising:
   a first shift register configured to include a plurality of stages which sequentially output scan pulses using four clock signals with sequential and circular phases; and
   a second shift register configured to include a plurality of stages which form pair with the respective stages of the first shift register and sequentially output the scan pulses using four clock signals,
   wherein, each of the stages includes,
   a scan direction controller configured to respond to the scan pulses from previous and next stages and to selectively output forward and reverse direction voltages with opposite electric potentials to each other; and
   an output portion configured to respond to the output signal of the scan direction controller, to generate two sequential scan pulses using two of the four clock signals, and to distribute the sequential scan pulses to the previous and next stages, and
   a node controller configured to respond to the output signal from the scan direction controller and to control signals on first and second nodes, and wherein the output portion is configured to respond to the signals on the first and second nodes and to generate the two sequential scan pulses using the other two clock signals of the four clock signals,
   wherein the node controller includes:
   wirings configured to independently charge the output signal of the scan direction controller into the first and second nodes;
   a first active switching element connected between a first clock line, which transfers one of the other two clock signals of the four clock signals, and a first common node;
   a first switching element turned-on/off by the signal on the first node and connected between the first common node and a discharging voltage line;
   a second switching element turned-on/off by a signal on the first common node and connected between the first node and the discharging voltage line;
   a second active switching element connected between a second clock line, which transfers the other one of the other two clock signals of the four clock signals, and a second common node;
   a third switching element turned-on/off by the signal on the second node and connected between the second common node and the discharging voltage line; and
   a fourth switching element turned-on/off by a signal on the second common node and connected between the second node and the discharging voltage line.

2. The dual shift register claimed as claim 1, wherein gate and drain terminals of the first active switching element are connected with the first clock line.

3. The dual shift register claimed as claim 1, wherein gate and drain terminals of the second active switching element are connected with the second clock line.

* * * * *